(12) United States Patent
Katsumura

(10) Patent No.: US 7,065,034 B2
(45) Date of Patent: Jun. 20, 2006

(54) OPTICAL DISC AND APPARATUS FOR MANUFACTURING A MASTER DISC THEREFOR

(75) Inventor: Masahiro Katsumura, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 11/057,597

(22) Filed: Feb. 15, 2005

(65) Prior Publication Data

US 2005/0201261 A1   Sep. 15, 2005

Related U.S. Application Data

(62) Division of application No. 09/984,251, filed on Oct. 29, 2001, now Pat. No. 6,882,615.

(30) Foreign Application Priority Data

Nov. 1, 2000   (JP) .............................. 2000-334119

(51) Int. Cl.
*G11B 7/24* (2006.01)
*B32B 3/02* (2006.01)

(52) U.S. Cl. .................... 369/275.4; 369/277; 428/64.4

(58) Field of Classification Search ............. 369/275.4, 369/275.1, 275.2, 44.13, 275.3, 44.37, 44.29, 369/283, 277, 278, 279, 112.01, 112.08, 112.05; 430/270.11; 428/64.1, 64.4, 694 ML
See application file for complete search history.

(56) References Cited

U.S. PATENT DOCUMENTS

| | | | |
|---|---|---|---|
| 5,943,313 A * | 8/1999 | Ando et al. ............... | 369/275.4 |
| 6,071,588 A | 6/2000 | Nobumasa et al. ......... | 428/64.4 |
| 6,181,672 B1 | 1/2001 | Muramatsu et al. ...... | 369/275.4 |
| 6,379,864 B1 * | 4/2002 | Inui et al. ............... | 430/270.11 |
| 6,771,587 B1 | 8/2004 | Nishiuchi et al. ........... | 369/283 |

* cited by examiner

*Primary Examiner*—Ali Neyzari
(74) *Attorney, Agent, or Firm*—Drinker Biddle & Reath LLP

(57) ABSTRACT

A master-disc-manufacturing apparatus includes an electron-beam emitting portion for emitting an electron beam, an electron-beam converging portion for converging an electron beam, a retarding voltage applying portion for applying a substrate with a negative potential having a magnitude of decelerating the electron beam, and a vacuum atmosphere producing portion for evacuating a chamber to produce a vacuum atmosphere therein.

1 Claim, 4 Drawing Sheets

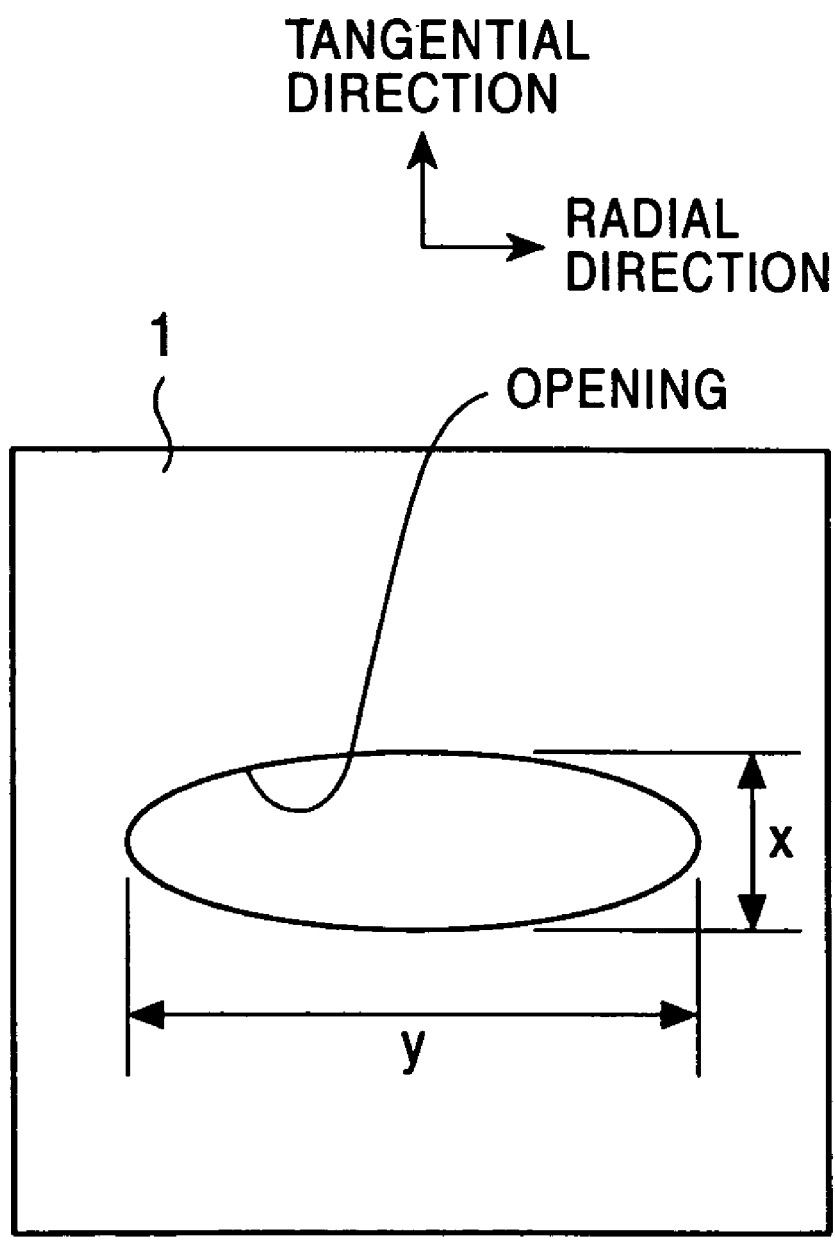

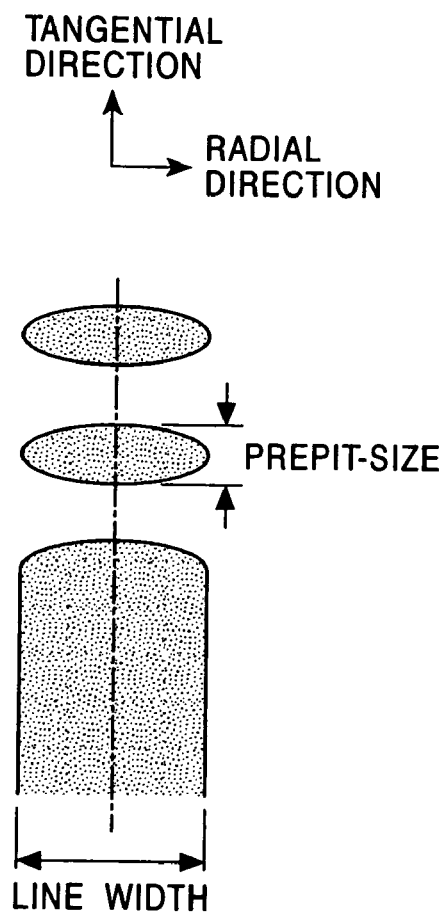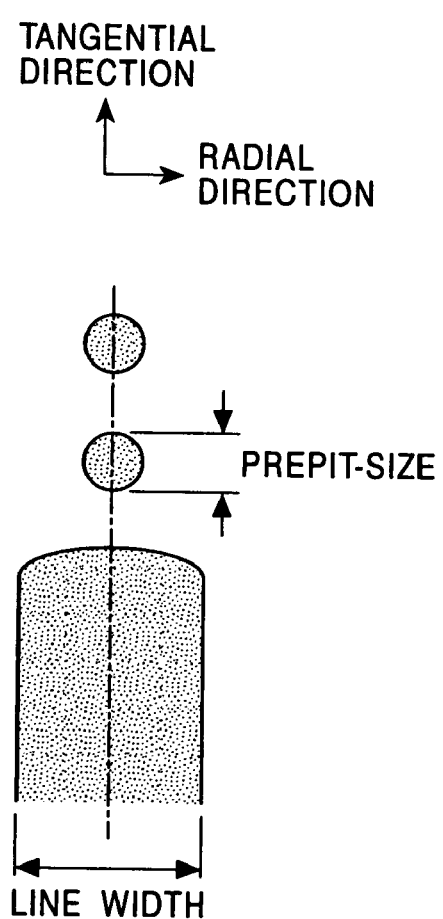

OPTICAL DISC AND APPARATUS FOR MANUFACTURING A MASTER DISC THEREFOR

This is a divisional application of prior application Ser. No. 09/984,251, filed on Oct. 29, 2001 now U.S. Pat. No. 6,882,615, which is incorporated by reference herein in its entirety.

BACKGROUND OF THE INVENTION

1. Field of the Invention

The present invention relates to an apparatus for manufacturing a master-disc using an electron beam irradiated to a substrate and further to an optical disc replicated from the master-disc.

2. Description of the Related Art

In recent years, there are under development of various kinds of optical discs with a large capacity such as a DVD (Digital Versatile Disc) capable of recording image/audio data and digital data thereon. Research and development are now under progress for increasing the recording capacity to, for example, 30 Gbytes for one optical disc having a diameter of 12 cm.

There is a conventional mastering or cutting process for manufacture of a master-disc which involves a laser beam of a visible or ultraviolet wavelength range. However, such a conventional method is limited in recording resolution of pits by the diameter (about 0.2 μm) of the laser beam spot illuminated on a substrate, in other words, the wavelength of used laser beam and the numerical aperture NA of used objective lens in the laser cutting machine limit the resolution.

Thus, investigations of electron beam cutting (electron beam exposure) have been made for a master-disc-manufacturing apparatus using an electron beam to produce a high density master-disc increased in the recorded data density thereon, since the diameter of the electron beam focused on the substrate can be smaller than that of the visible or ultraviolet laser beam.

The high density master-disc may having an extremely minute track pitch of 1 μm or less. In order to cutting a master-disc for an optical disc of ROM type, the spot dimensions of the electron beam to be used are decided on the basis of the dimensions of the necessary prepits.

In the master-disc-manufacturing apparatus using the electron beam, only one electron beam can be used. Therefore, there is a drawback that the mastering of minute prepits and the cutting of a wide groove for guide are incompatible with each other in the same apparatus.

OBJECT AND SUMMARY OF THE INVENTION

The present invention is made in view of the problems mentioned above, and its object is to provide a high-density optical disc and a master-disc-manufacturing apparatus capable of manufacturing a high-density master-disc therefore.

To achieve the object, according to one aspect of the present invention, there is provided an apparatus for manufacturing a master-disc by irradiation of an electron beam on a disc substrate placed on a turntable disposed within a vacuum chamber, comprising:

a beam source emitting an electron beam;

a convergence device for converging the electron beam onto a disc substrate; and a shaping-aperture plate provided in said the convergence device and having an opening for shaping a transverse cross section of the electron beam, wherein said opening has a first internal diameter stretched in a radial direction of said disc substrate and a second internal diameter shorter than the first internal diameter and stretched in a tangential direction of said disc substrate.

According to one aspect of the present invention of the master-disc-manufacturing apparatus, said first internal diameter of the opening is in a range of x<y≦3x wherein x denotes the second internal diameter and y denotes the first internal diameter.

According to the present invention, there is also provided an optical disc comprising: a disc substrate; a land and a groove spirally or concentrically formed on the disc substrate wherein the groove has a line width stretched in a radial direction of said disc substrate; and prepits formed on the land or the groove, wherein each of the prepits has an internal diameter stretched in a tangential direction of said disc substrate, characterized in that said internal diameter of the prepit is shorter than said line width of the groove.

According to one aspect of the present invention of the optical disc, said line width of the groove is in a range of v<h≦3v wherein h denotes the line width and v denotes the internal diameter of the prepit.

According to another aspect of the present invention of the optical disc, said internal diameter of the prepit is in a range of from 100 nm to 300 nm.

BRIEF DESCRIPTION OF THE DRAWINGS

FIG. 1 is a plan view illustrating a shaping-aperture plate in the master-disc-manufacturing apparatus according to the invention using the electron beam;

FIGS. 2A and 2B are plan views each illustrating a beam profile illuminated by an electron beam on a disc substrate for an optical disc according to the invention;

DETAILED DESCRIPTION OF THE EMBODIMENTS

Figure 3:
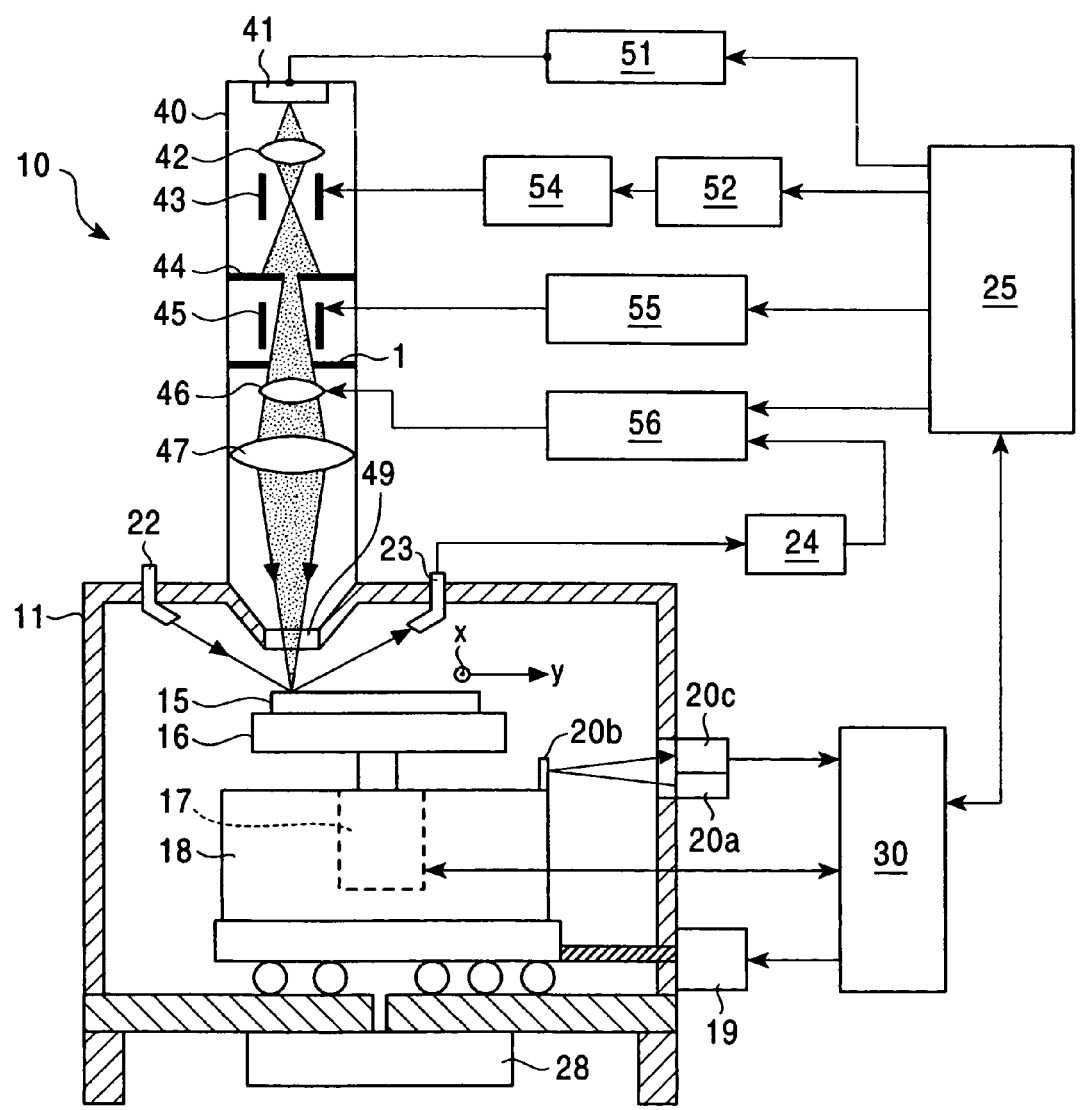
FIG. 3 is a block diagram illustrating the configuration of a master-disc-manufacturing apparatus using an electron beam according to the present invention.

Embodiments of the present invention will now be described in detail with reference to the accompanying drawings.

An electron beam is used in a vacuum space since the electron beam has the properties of greatly attenuating in the atmospheric pressure. Therefore, an electron gun, a turntable for holding a disc substrate thereon for mastering a master-disc, and so on are disposed in a vacuum chamber.

For manufacturing a master-disc, for example, a silicon (Si) plate is used as a substrate. The silicon substrate is coated with an electron beam resist on the principal surface. The substrate coated with the electron beam resist is rotated, and irradiated with an electron beam modulated by an information data signal to spirally or concentrically form a latent image of miniature concave/convex patterns such as pits and grooves in a master-disc-manufacturing apparatus.

The master-disc-manufacturing apparatus, which will be described in great detail later, includes a beam source emitting an electron beam; and a convergence device for converging the electron beam onto the disc substrate, in an electron beam column. The convergence device includes a shaping-aperture plate partially limiting an electron beam emitted from the beam source. The shaping-aperture plate is a perforated metal plate having an opening or through-hole to shape a transverse cross section of the electron beam passing therethrough. As shown in FIG. 1, the opening of the shaping-aperture plate 1 has a first and second internal diameters which are measured in the radial and tangential directions of the disc substrate respectively, in characterized in that the second internal diameter x thereof is shorter than the first internal diameter y of the opening of the shaping-aperture plate.

In the mastering device i.e., master-disc-manufacturing apparatus, the opening of the shaping-aperture plate 1 should be designed on the basis of a required size of the prepit so that the electron beam irradiated on the substrate has an optimum diameter in the tangential direction of the substrate. That is, a diameter of the prepit measured in the tangential directions of the substrate (hereinafter, simply called the "prepit-size") defines the second internal diameter x of the opening of the plate and, a width of the groove measured in the radial direction of the substrate (hereinafter, simply called the "line width") defines the first internal diameter y of the opening of the plate. In this way, the mastering of a high density disc substrate will be preformed with only one electron beam by using the shaping-aperture plate 1 having an ellipse as shown in FIG. 1 or oval, or a corner-rounded rectangular having an opening ratio of the second internal diameter x and the first internal diameter y longer than x.

The master-disc-manufacturing apparatus having the shaping-aperture plate 1 is capable of mastering the substrates for an optical disc having the configuration of prepit and groove as shown in FIGS. 2A and 2B in which the prepit-size is in a range from 100 nm to 300 nm and the line width is in a range from 100 nm to 900 nm. Thus, by using values of the prepit-size and the line width, the opening ratio of the shaping-aperture plate is decided to be in a range satisfying the equation of the second internal diameter x: the first internal diameter y=1:1 to 1:3. In other words, the first internal diameter of the opening is preferably in a range of $x<y \leq 3x$ wherein x denotes the second internal diameter and y denotes the first internal diameter.

By changing the opening ratio of the shaping-aperture plate, the laser beam profile i.e., spot illuminated by an electron beam on a disc substrate for an optical disc is changed, for example, as shown in FIG. 2A as the opening ratio is 1:3 and as shown in FIG. 2B as it is 1:1.

The disc substrate is removed from the master-disc-manufacturing apparatus after the electron beam exposure is terminated, and then the disc substrate is developed so that miniature concave/convex patterns is formed on the resist film thereof. The patterned resist film of the substrate is coated with a conductive metal film and then undergoes an electroplating step in which a metal substrate is grown on the metal film. After that, the grown metal substrate is removed from the patterned resist film of the substrate. Thus, the master-disc is fabricated as a stamper.

By using the master-disc, optical discs mass-produced through an injection molding process of plastics.

Figure 5:
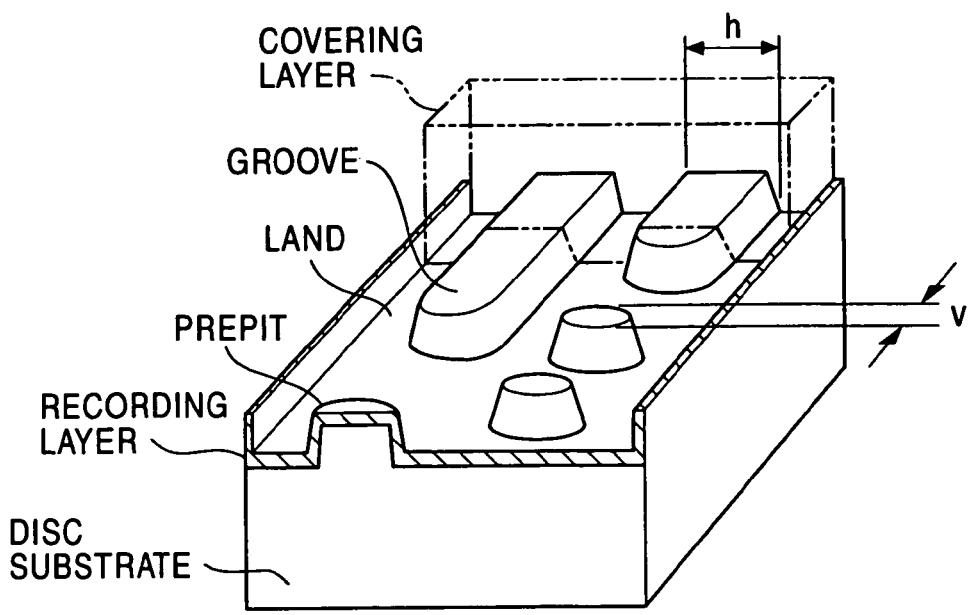
FIG. 5 is a partially cut perspective view illustrating of an optical disc of groove/land type according to the present invention.

As shown in FIG. 5, the resultant optical disc has a land and a groove spirally or concentrically formed on the metal substrate in which the groove has the line width; and prepits formed on the land or the groove, wherein each prepit has the internal diameter stretched in a tangential direction of the substrate, characterized in that the internal diameter of the prepit is shorter than the line width of the groove.

In the optical disc, the line width of the groove is in a range of $v<h \leq 3v$ wherein h denotes the line width and v denotes the internal diameter of the prepit. The internal diameter of the prepit on the optical disc is in a range of from 100 nm to 300 nm.

FIG. 3 is a block diagram illustrating one example of configuration of a master-disc-manufacturing apparatus 10 using an electron beam according to an embodiment of the present invention.

As illustrated in FIG. 3, the master-disc-manufacturing apparatus 10 includes a vacuum chamber 11 which has a driving unit for driving a substrate placed therein, and an electron beam column 40 mounted on the vacuum chamber 11.

A substrate 15 for an optical disc master-disc is held on a turntable 16. The turntable 16 is rotated about a vertical axis of the principal surface of the substrate by an air spindle motor 17, which is a rotating device for rotating the substrate 15. The air spindle motor 17 is accommodated in a feed stage (hereinafter, simply called the "stage") 18. The stage 18 is coupled to a feed motor 19, which is a driving device for a translational motion, so that it can translate the air spindle motor 17 and the turntable 16 in a predetermined direction in a plane parallel to the principal surface of the substrate 15. The vacuum chamber 11 is provided with a laser emitter 20a and a laser receiver 20c and the stage 18 carrying the turntable 16 is provided with are a reflector 20b reflecting a laser beam emitted from the emitter to the receiver, those components belongs to a laser range finder system.

The turntable 16 is provided with an electrostatic chucking mechanism for supporting the peripheral portion of the substrate 15.

The vacuum chamber 11 is also provided with a light source 22, a photodetector 23 and a level detector 24 for detecting the height level of the principal surface of the substrate 15. The photodetector 23, which includes, for example, a position sensor, CCD (Charge Coupled Device) or the like, receives a light beam emitted from the light source 22 and reflected from the surface of the substrate 15, and supplies a light receiving signal to the level detector 24. The level detector 24 detects the level of the principal surface of the substrate 15 based on the light receiving signal.

The vacuum chamber 11 is installed by way of a vibration isolator (not shown) such as an air damper to suppress transmission of external vibrations. Also, the vacuum chamber 11 is connected to a vacuum pump 28 which evacuates the vacuum chamber 11 such that the chamber is set in a vacuum of a predetermined pressure.

A driving controller 30 is also provided for controlling the air spindle motor 17 and the feed motor 19. The driving controller 30 operates under control of a main controller (CPU) 25 which controls the master-disc-manufacturing apparatus 10.

The electron beam column 40 for emitting an electron beam comprises an electron gun 41, a converging lens 42, blanking electrodes 43, an the aperture plate 44, beam deflecting electrodes 45, a focus adjusting lens 46, and an objective lens 47 disposed in this order in the electron beam column 40. The electron beam column 40 has an electron beam emitting port 49 formed at a leading end thereof, oriented to a space within the vacuum chamber 11. The electron beam column 40 is attached on the ceiling surface of the vacuum chamber 11. Also, the electron beam emitting port 49 is formed opposite to a position near the principal surface of the substrate 15 on the turntable 16.

The electron gun 41 emits an electron beam accelerated to, for example, several tens of KeV by a cathode (not shown) which is applied with a high voltage supplied from an electron gun power supply 51. The converging lens 42 converges the emitted electron beam and leads the converged electron beam to the aperture plate 44. A blanking driving unit 54 operates based on a signal from a recording controller 52 to control the blanking electrodes 43 for controlling the electron beam between on and off operation. Specifically, the blanking driving unit 54 applies a voltage across the blanking electrodes 43 to greatly deflect the electron beam passing therethrough. In this way, the electron beam is not converged on the iris hole of the aperture plate 44, i.e., blocked to pass through the aperture plate 44, so that the electron beam is controlled to be off.

A beam deflection driving unit 55 deflects the electron beam passing through the beam deflecting electrodes 45 by applying a voltage across the electrodes 45 in response to a control signal from the CPU 25. In this way, the position of the electron beam spot is controlled with respect to the substrate 15.

Immediately under the beam deflecting electrodes 45, the shaping-aperture plate 1 shown in FIG. 1 is disposed as a diaphragm perpendicular to the axis. The shaping-aperture plate 1 may be replaceable with another one. In another configuration of the plate, the opening of the shaping-aperture plate 1 may be mechanically changeable from a circle to an ellipse or oval.

Immediately under the shaping-aperture plate 1, the focus adjusting lens 46 is disposed. The focus adjusting lens 46 is controlled by the focus lens driving unit 56 to adjust the focus of the electron beam spot irradiating the principal surface of the substrate 15 based on a detection signal from the level detector 24. Further, the driving controller 30, the electron gun power supply 51, the recording controller 52, the beam deflection driving unit 55 and the focus lens driving unit 56 operate based on signals from CPU 25 respectively.

There has been investigated the relationship between the dimension of the opening of the shaping-aperture plate and the beam diameter of the substrate in the master-disc-manufacturing apparatus. The knife-edge determination is used for the method of measurement. This method is performed as follows: Faraday cup (ammeter) is disposed under a knife-edge member so that the edge of the member bridges over the cup. An electron beam is scanned from the knife-edge member to the Faraday cup in the direction perpendicular to the edge portion of the member under the condition that the beam aperture of the electron beam is shaped by the shaping-aperture plate. The change of current output from the Faraday cup is measured, so that a rising time of current value is decided as corresponding to the diameter of the scanned electron beam spot. The knife-edge determination is preformed in master-disc-manufacturing apparatus in such a manner that the diameter dimension of opening is changed from 60 nm to 120 nm in response to the dimensions of prepits.

Figure 4:
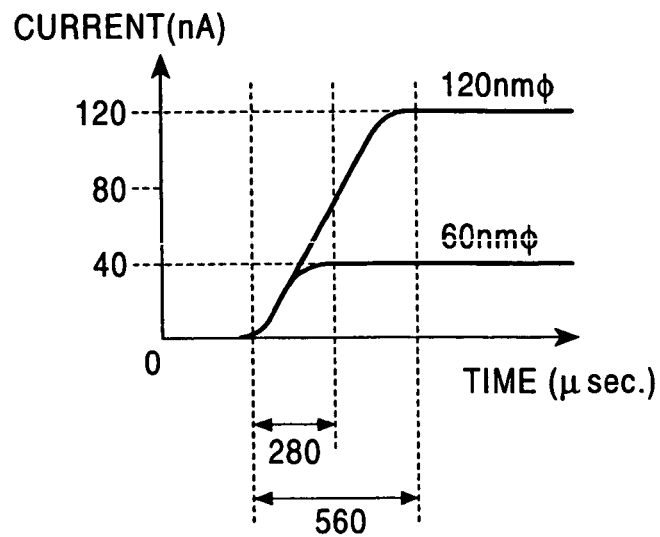
FIG. 4 is a graph of current-time explaining a relationship between the opening-diameter of a shaping-aperture plate and a beam diameter.

As a result, FIG. 4 shows a relationship of current-time in which the rising time of current corresponds to the diameter of the scanned electron beam spot on the Faraday cup. As seen form FIG. 4, when the shaping-aperture plate with a 60 nm $\phi$ opening is replace with the 120 nm $\phi$ one, then the rising time of current (implying the beam diameter) changes from 280 μsec. (40 nA saturation) to 560 μsec. (120 nA saturation). Therefore, the diameter of electron beam spot on the substrate is relative to the dimension, i.e., diameter of the opening of the shaping-aperture plate. It is confirmed that the diameter of beam spot, i.e., latent image irradiated on the substrate is dependent on the diminution of opening of the shaping-aperture plate. In addition, the opening shape of the shaping-aperture plate is not limited by an ellipse or oval, and a polygonal such as a rectangle and the like may be used for the opening of the shaping-aperture plate.

As mentioned above, according to the invention, since the opening of the shaping-aperture plate is changeable, the groove and prepits are simultaneously formed using only one electron in the mastering process.

While the foregoing embodiment has been described for a master-disc-manufacturing apparatus for an optical disc taken as an example, the present invention is not limited to the apparatus but may be applied to an apparatus for manufacturing a magnetic disc or platter of a hard disk drive. Also, the present invention can also be applied to a disc manufacturing apparatus which forms miniature shapes by electron beam direct drawing without using a resist.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application No. 2000-334119 which is hereby incorporated by reference.

What is claimed is:

1. An optical disc comprising: a disc substrate; a land and a groove spirally or concentrically formed on the disc substrate wherein the groove has a line width stretched in a radial direction of said disc substrate; and prepits formed on the land or the groove, wherein each of the prepits has an internal diameter stretched in a tangential direction of said disc substrate, characterized in that said internal diameter of the prepit is shorter than said line width of the groove, wherein said line width of the groove is in a range of $v < h \leq 3v$ wherein h denotes the line width and v denotes the internal diameter of the prepit, and wherein said internal diameter of the prepit is in a range of from 100 nm to 300 nm.

* * * * *